United States Patent
Takagi (10) Patent No.: US 6,704,897 B1
(45) Date of Patent: Mar. 9, 2004

(54) SEMICONDUCTOR DEVICE AND THE TEST SYSTEM FOR THE SAME

(75) Inventor: Ryoichi Takagi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 398 days.

(21) Appl. No.: 09/669,577

(22) Filed: Sep. 26, 2000

(30) Foreign Application Priority Data

Mar. 30, 2000 (JP) ........................................ 2000-095552

(51) Int. Cl.[7] ............................................... G01R 31/28
(52) U.S. Cl. ....................................................... 714/739
(58) Field of Search ................................. 714/724, 728, 714/FOR 101, 735, 736, 737, 738, 739

(56) References Cited

U.S. PATENT DOCUMENTS

| | | | | |
|---|---|---|---|---|
| 5,619,512 A | * | 4/1997 | Kawashima et al. | 714/733 |
| 5,701,309 A | * | 12/1997 | Gearhardt et al. | 714/736 |
| 6,105,156 A | * | 8/2000 | Yamauchi | 714/738 |
| 6,112,321 A | * | 8/2000 | Shimada et al. | 714/718 |
| 6,114,866 A | * | 9/2000 | Matsuo et al. | 324/760 |
| 6,175,939 B1 | * | 1/2001 | Dinteman | 714/724 |
| 6,223,312 B1 | * | 4/2001 | Nozuyama | 714/724 |
| 6,275,057 B1 | * | 8/2001 | Takizawa | 324/765 |
| 6,282,680 B1 | * | 8/2001 | Takagi et al. | 714/724 |
| 6,347,387 B1 | * | 2/2002 | Fischer | 714/738 |
| 6,397,363 B1 | * | 5/2002 | Maeno et al. | 714/726 |
| 6,477,674 B1 | * | 11/2002 | Bates et al. | 714/738 |

FOREIGN PATENT DOCUMENTS

| | | |
|---|---|---|
| JP | 62-115381 | 5/1987 |
| JP | 7-218593 | 8/1995 |

* cited by examiner

Primary Examiner—Albert Decady
Assistant Examiner—Matthew C. Dooley
(74) Attorney, Agent, or Firm—Burns, Doane, Swecker & Mathis, LLP (57) ABSTRACT

A test system includes a semiconductor device having a circuit configuration including an input buffer circuit, an output buffer circuit, and an internal logic, a random data generation circuit being provided at the front stage of the output buffer circuit; a random data generator, incorporating a random data generation circuit, for applying a random data to an input of the input buffer circuit from the random data generation circuit; and a test board on which the semiconductor device and random data generator is mounted and electrically connected to each other.

8 Claims, 7 Drawing Sheets

SEMICONDUCTOR DEVICE AND THE TEST SYSTEM FOR THE SAME

BACKGROUND OF THE INVENTION

1. Field of the Invention

The present invention relates to a semiconductor device and a test system for the same directed to design for testability, and in particular, relates to an LSI test with a high-speed operation.

2. Description of the Prior Art

Figure 8:
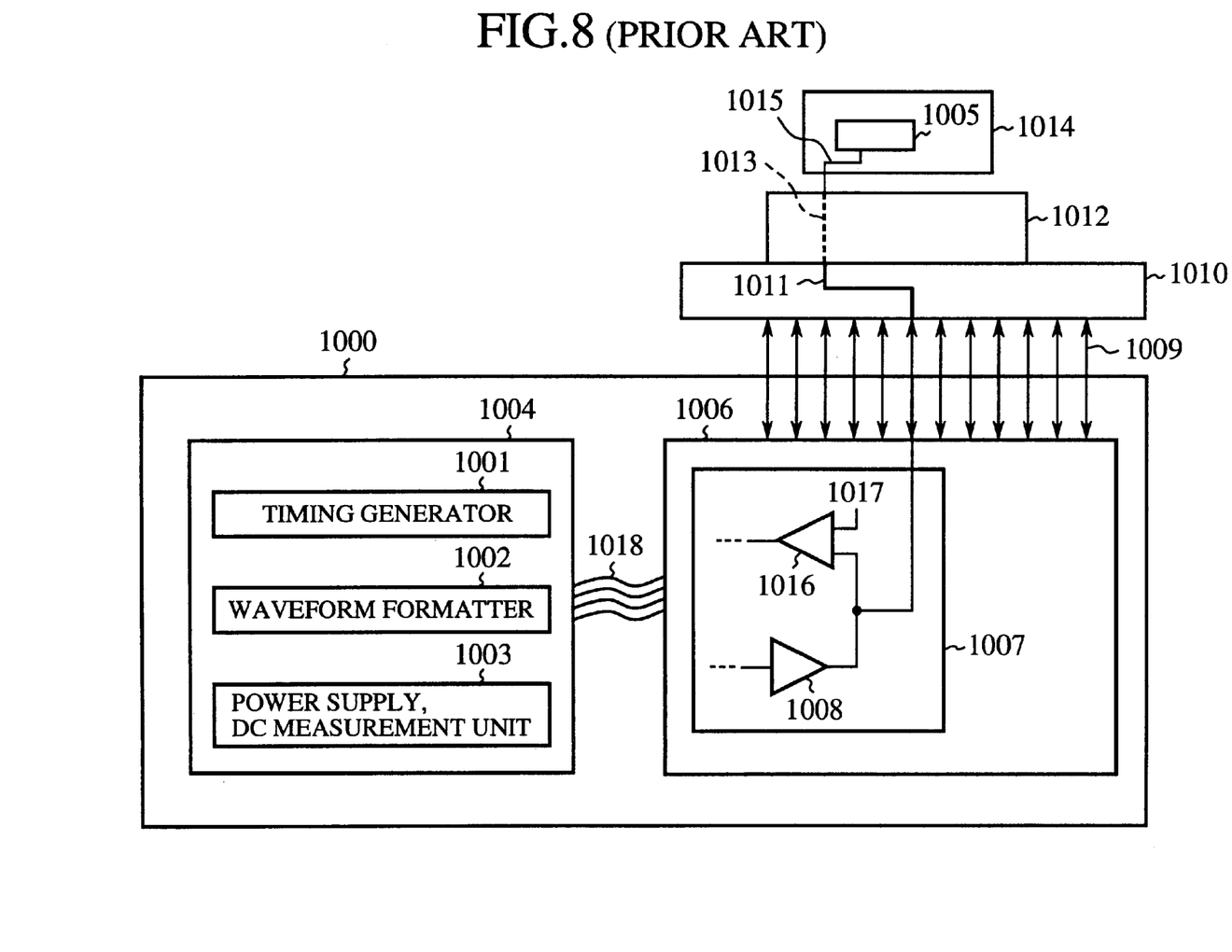
FIG. 8 is a block diagram of a conventional semiconductor test apparatus on a test implementation.

FIG. 8 is a block diagram of a semiconductor test device (hereinafter, referred to as LSI tester) showing a configuration on a test implementation for a semiconductor device (hereinafter, referred to as LSI). In FIG. 8, the reference numeral 1000 designates an LSI tester, 1001 designates a timing generator, 1002 designates a waveform formatter, 1003 designates a DC measurement unit having a power supply, 1004 designates a tester main body, 1005 designates an LSI to be tested or DUT (Device Under Test), 1006 designates a test head, 1007 designates a pin electronics, 1008 designates a test driver, 1016 designates a test comparator, 1017 designates an expected value, and 1018 designates a cable.

The LSI tester comprises the tester main body 1004 and the test head 1006. The tester main body 1004 includes the timing generator 1001 for generating a timing signal required as an LSI test condition, the waveform formatter 1002 for determining a waveform shape, and the DC measurement unit 1003 for measuring a power supply for a device and/or DC of the device. The test head 1006 carries-out directly a signal reception/transmission to the DUT 1005 based on a control signal provided through the cable 1018 from the tester main body 1004.

The operation will be next described below.

On testing the DUT 1005, a test signal is generated from the tester driver 1008 of the pin electronics 1007 stored in the test head 1006, and the test signal is applied to the DUT 1005 through pogo pins 1009, a wiring on a DUT board 1010, an electrode 1013 of a socket 1012, and a wiring 1015 of an LSI package 1014. Reversely, a reaction signal after the operation of the DUT 1005 is transmitted to the test comparator 1016 of the LSI tester 1000 through the similar route, and is compared to the expected value 1017 by the test comparator 1016. In this manner, the LSI tester 1000 determines whether the DUT 1005 operates according to the design or not.

Since the conventional semiconductor device and test system for the same to be subjected to the LSI tester is configured as described above, though they are applied to DC, AC, function tests of LSIs, the LSI tester requires a still higher frequency and precision due to multiple pins and a higher speed test, resulting in a high price, which is not economical.

In addition, high-speed tests become difficult even in view of a physical phenomenon based on the following reasons: Waveform shapes of the test data are different from those of a real specification because of a special specification of input/output pins of the DUT, and a timing precision of the tester does not catch up with that required for the DUT.

SUMMARY OF THE INVENTION

The present invention is implemented to solve the foregoing problems. It is therefor an object of the present invention to provide a semiconductor device and a test system for the same to implement a self-test and a multiple pins test at the same interface specification as a real device due to an external or internal disposition of a test data generator, and to be capable of facilitating a high-speed test.

According to a first aspect of the present invention, there is provided a semiconductor device having a circuit configuration comprising: an input buffer circuit, an output buffer circuit, and an internal logic, wherein at least either a data compaction circuit having a data compaction function, a data comparison function, or both is provided at the next stage of the input buffer circuit, or a random data generation circuit is provided at the front stage of the output buffer circuit.

Here, the input buffer circuit further may comprise: a dummy driver cell including a delay circuit which generates a phase shifted clock shifted in a phase timing of a clock input to a first latch circuit and is input by the phase shifted clock, and a dummy driver circuit to be input by a data generated in such a manner that the phase shifted clock is input to the first latch circuit; and a receiver cell including a receiver circuit for receiving a data from the dummy driver cell, and a second latch circuit which latches and outputs a data from the receiver circuit and a first external pin by an input of the clock.

In addition, the output buffer further may comprise:
a dummy driver cell including a third latch circuit which latches and outputs a data from a first external pin by an input clock, and a driver circuit for receiving a data from the third latch circuit through a selector; and a dummy receiver cell including a dummy receiver circuit for receiving a data from said driver cell, a delay circuit for generating a phase shifted clock which is shifted in a phase timing, and a fourth latch circuit which latches and outputs a data from the dummy receiver circuit and the first external pin by the phase shifted clock.

According to a second aspect of the present invention, there is provided a test system for a semiconductor device comprising: a semiconductor device having a circuit configuration including an input buffer circuit, an output buffer circuit, and an internal logic, said circuit configuration being implemented by (a) a data compaction circuit having a data compaction function, a data comparison function, or both is provided at the next stage of the input. buffer circuit, or (b) a random data generation circuit is provided at the front stage of the output buffer circuit; a random data generator, incorporating the random data generation circuit, for applying a random data to an input of the input buffer circuit from the random data generation circuit; and a test board mounting the semiconductor device and the random data generator thereon, and electrically connected to each other.

Here, the semiconductor device may be circuit configured by including a selector provided between the data compaction circuit and the internal logic, and a scan path provided between the data compaction circuit and the external pin.

In addition, a clock circuit may be included in the random data generator, and a delay circuit positioned at the next stage of the clock circuit may include a D/A converter, a resistor, a capacitor, a differential amplifier, and a slew rate buffer.

Further, the random data generation circuit and the data compaction circuit may be electrically connected to each other through a plurality of latch circuits, and each of the random data generation circuit and the data compaction circuit may be constituted by inserting a logic gate in a feedback loop.

According to a third aspect of the present invention, there is provided a test system for a semiconductor device comprising: a first semiconductor device and a second semiconductor device each including (a) a data compaction circuit having a data compaction function, a data comparison function, or both provided at the next stage of an input buffer circuit, (b) a random data generation circuit provided at the front stage of an output buffer circuit, and (c) an internal logic electrically connected to the data compaction circuit and the random data generation circuit; a first socket assigned for a tester by all the pins of the first semiconductor device; a second socket assigned for the tester by only the pins selected for a self-test of the second semiconductor device; a test board on which the first and second semiconductor devices are mounted through the first and second sockets, respectively, wherein an output pin and an input pin of the second semiconductor device are electrically connected to each other on the test board.

DETAILED DESCRIPTION OF THE PREFERRED EMBODIMENTS

An embodiment of the present invention will be described below.

EMBODIMENT 1

Figure 1:
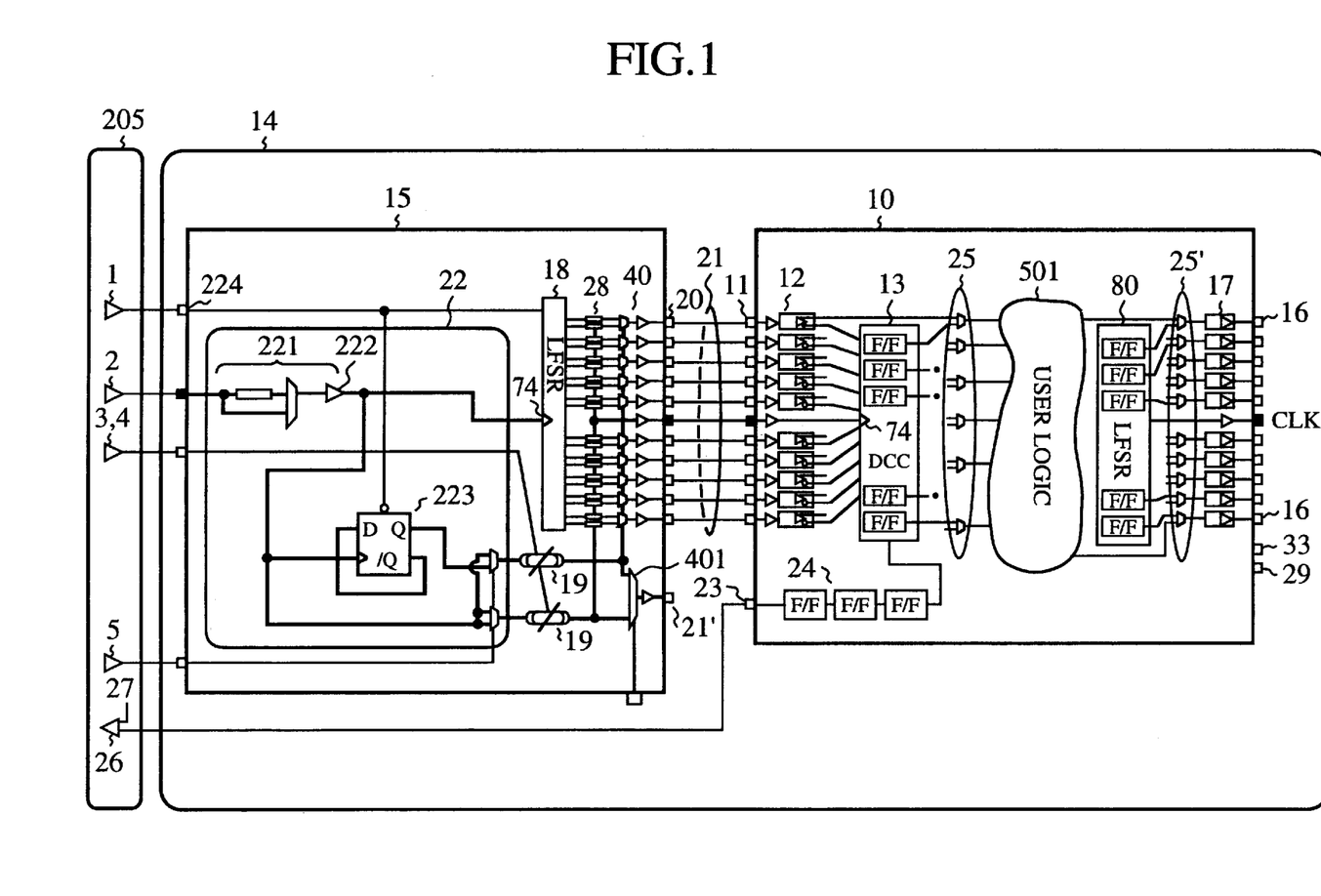
FIG. 1 is a circuit diagram of a test system for a semiconductor device according to an embodiment 1 of the present invention.

FIG. 1 is a circuit diagram showing a test system for a semiconductor device according to an embodiment 1 of the present invention. In FIG. 1, the reference numerals 1–5 each designate a driver included in an LSI tester 205; 10 designates an LSI to be tested or DUT as a semiconductor device; 11 designates an input pin; 12 designates a receiver included in an input buffer circuit and connected to the input pin 11; 13 designates a data compaction circuit (DCC) which has a data compaction or comparison function, or both; 14 designates a DUT board as a test board; and 15 designates a random data generator as a signal generator including a module and the like constituted by LSIs and discreet components, and the random data generator may be a DUT (production) which is determined as a non-defective device other than the module. The reference numeral 16 designates an output pin of the DUT 10; 17 designates a driver included in an output buffer circuit of the DUT 10; 18 and 80 designate a random data generation circuit or LFSR; and 19 designates a timing adjustment circuit which may adjust exactly a timing of output data, also referred to as a delay or vernier circuit.

In addition, the reference numeral 20 designates an external pin (data pin) of the random data generator 15; 21' designates a clock monitor pin (clock pin) which may monitor a clock via the vernier circuit 19 also as an external pin; and 21 is a connection line which connects electrically the random data generator 15 to the DUT 10, for example, illustrating a bit line of 11 bits in FIG. 1.

In addition, the reference numeral 22 designates a clock circuit; 221 designates a PLL; 222 designates a clock driver; 223 designates a flip flop constituting a dividing circuit, corresponding to a one-half division of a clock at one stage and a one-quarter division of the clock at two stages. The clock circuit 22 is connected to the vernier circuit 19 through a selector prepared at the subsequent stage of the flip-flop 223. The reference numeral 23 designates an external pin of the DUT 10 (abbreviated as TDO) for test data outputs; 24 designates a scan path; 205 designates an LSI tester; 26 designates a comparator; 27 designates an expected value; 28 designates a flip-flop; 29 designates a test mode signal pin which may bring an internal setting of an LSI chip to testable circumstances, 33 designates an external pin (abbreviated as TDI) for test data inputs; 401 designates a selector; 40 designates an output driver of the random data generator 15; 501 designates an internal or user logic of the DUT 10; 74 designates a clock pin; and 224 designates a reset signal pin.

According to the embodiment 1, in the input buffer circuit of the DUT 10, the data compaction circuit 13 is provided at the subsequent stage of the receiver 12 connecting to the input pin 11; the output driver 40 of the random data generator 15 is connected to the random data generating circuit 18 and has the same specification as that of the driver 17 of the output buffer circuit connected to the output pin 16. A random data application to the input pin 11 of the DUT 10 is performed by a supply from the random data generator 15 mounted on the DUT board 14.

The random data generator 15 incorporates the vernier circuit 19 which may adjust exactly the timing of the output data, and may change timing phases in the data pin 20 and clock monitor pin 21'. In addition, the clock circuit 22 incorporated by the random data generator 15 is the same quality as the DUT 10, and is able to output a random data at a clock speed in actual operations.

The operation will be next described below.

The test data output from the random data generator 15 is received via the output pin 20 as an output pin of the random data generator 15 and the input pin 11 of the DUT 10 connected electrically to the connection line 21, and the random data supplied in succession is compacted by the data compaction circuit 13 at a real operation speed of the DUT 10. After such a series of the data compaction operation is completed, the data accumulated in the data compaction circuit 13 has to be output to the external pin 23 of the DUT 10 to be verified. For this reason, the data compacted in the data compaction circuit 13 of the DUT 10 is extracted to the LSI tester 205 from the external pin 23, e.g. by use of the scan path 24, and checked with the expected value 27 to be verified. Herein, the expected value 27 is a reference value that, e.g. when a threshold value Vth of 'H' level is set to one level (e.g., 1.3 V or more), an output over this level (e.g., 1.5 V) is accepted as passing.

Figure 2:
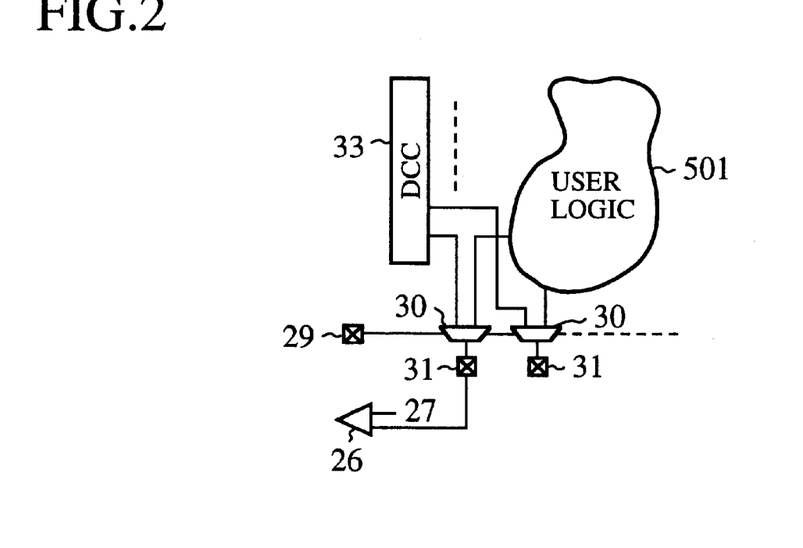
FIG. 2 is a circuit diagram showing a modification of a test system for a semiconductor device according to the embodiment 1 of the present invention.

FIG. 2 is a circuit diagram showing a modification of a test system for a semiconductor device according to the embodiment 1 of the present invention. In FIG. 2, the reference numeral 30 designates a selector; 31 designates an external pin and allows a common use with users. Note that the same reference numerals denote the same or corresponding components and omit these explanations. The same manner will be applied below.

With this circuit configuration, another method may be also considered as follows: A test mode signal is input to the test mode signal pin 29 in order to output a data compacted by the data compaction circuit 13 of the DUT 10, e.g. a compacted data of 11 bits in FIG. 1, to the external pin 31; and then the data output via the selector 30 is checked and verified with the expected value 27 at the comparator 26 of the LSI tester 205.

Figure 3A:
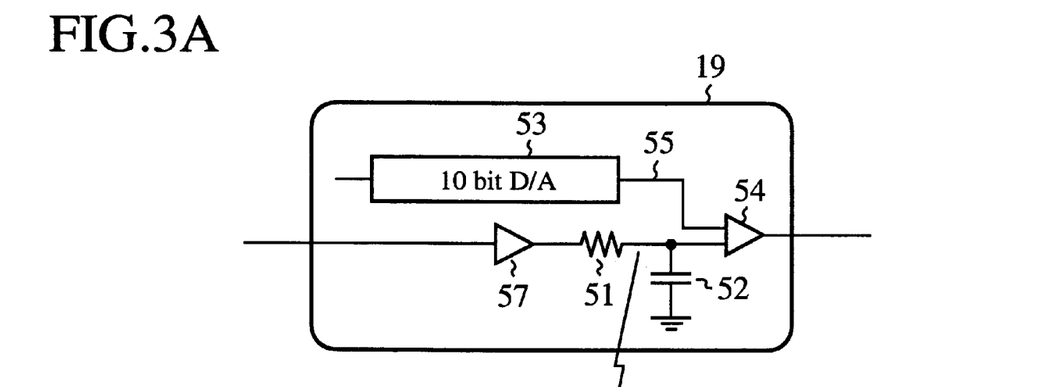
FIGS. 3A and 3B are a partially enlarged view of a vernier circuit and a timing waveform view according to the embodiment 1 of the present invention, respectively.

FIG. 3A is a partially enlarged view of a vernier circuit or a delay circuit. In FIG. 3A, the reference numeral 51 designates a resistor; 52 designates a capacitor; 53 designates a 10 bit D/A converter; 54 designates a differential amplifier; 55 designates a reference input; and 57 designates a buffer. The vernier circuit 19 is comprised of the resistance 51, the capacitor 52, the 10 bit D/A converter 53, the differential amplifier 54, and the buffer 57 of a slew rate: 1 V/1 ns.

Figure 3B:
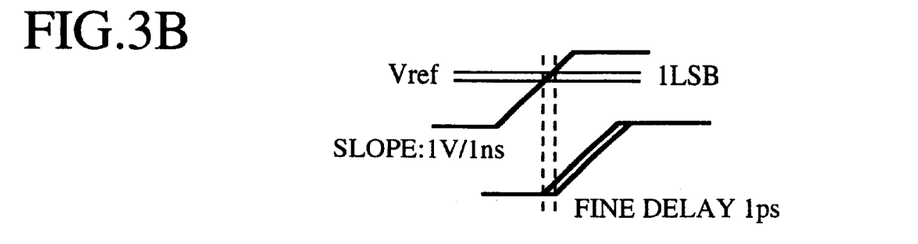

In this manner, in order to be capable of setting the slew rate of 1 V/1 ns at a step level of 1000 steps, a voltage level controlled by a digital code of 10 bits is applied to the reference input 55 of the differential amplifier 54, and is subjected to a differential operation with a slew rate waveform, thereby enabling timing fine adjustment at the level of 1 LSB=1 ps (see FIG. 3B).

Figure 4:
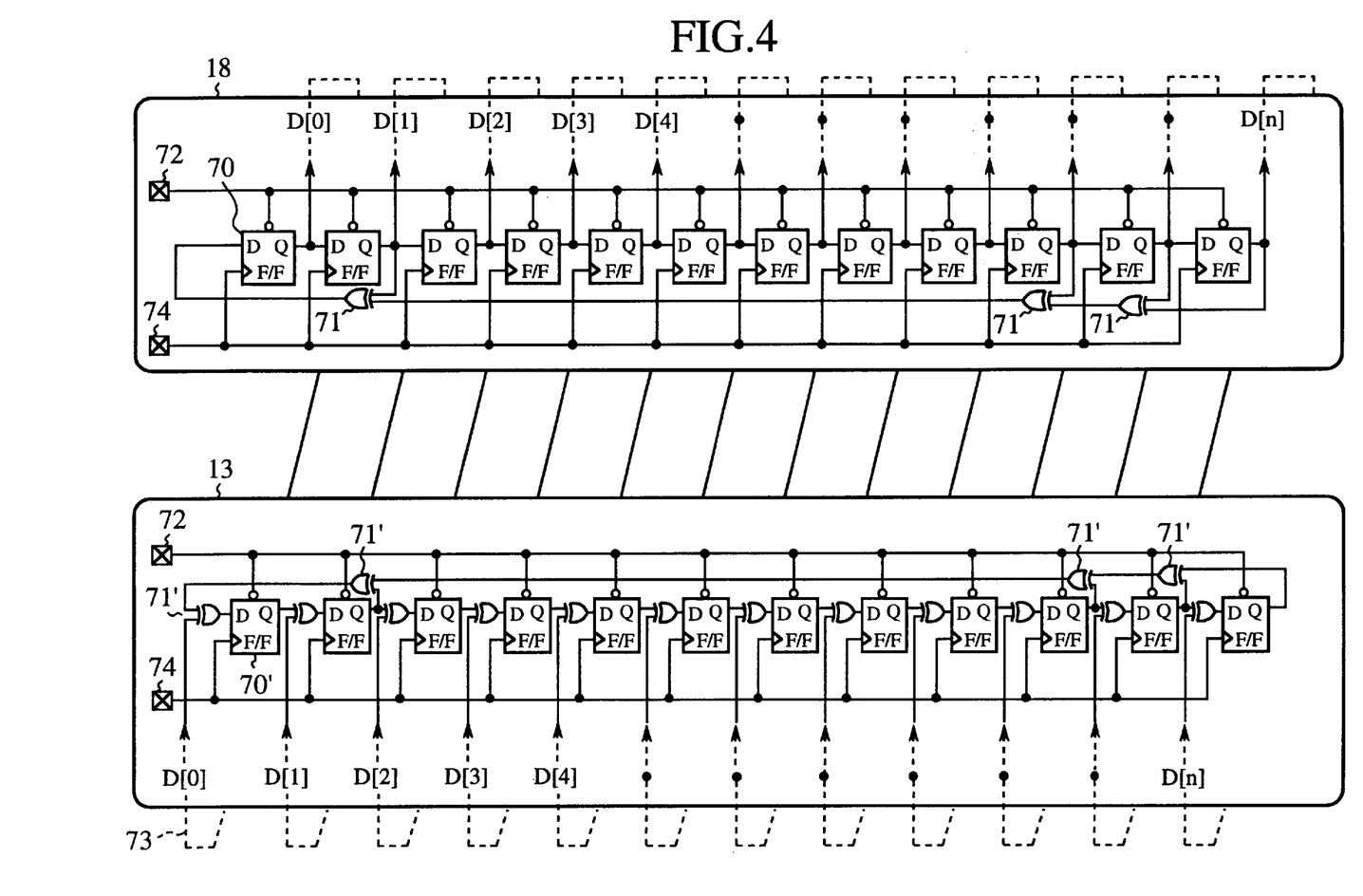
FIG. 4 is a circuit diagram showing a test system for a semiconductor device in detail according to the embodiment 1 of the present invention.

FIG. 4 is a circuit diagram showing the test system for a semiconductor device in detail according to the embodiment 1, and illustrates an example of connection relationships between the random data compaction circuit 18 and data compaction circuit. In FIG. 4, the reference numeral 13 designates a data compaction circuit on the input side; 18 designates a random data generation circuit on the output side; 70 and 70' each designate a flip-flop as n latch circuits (n: natural number); 71 and 71' each designate an EOR gate as a logic gate; 72 designates a reset signal pin; 73 designates a connection line; and 74 designates a clock pin. The random data generation circuit 18 is constituted by preparing n flip-flops 70 corresponding to n bits of data pins or the external pins 20, and inserting the EOR gate 71 in a partial feedback loop to the flip-flop 70.

The operation will be next described below.

On testing, the random data generation circuit 18 first generates n2-1 random data by a feedback loop to the flip-flop 70 through the EOR gate 71, the random data is transmitted by way of the connection line 73, the EOR gate 71' in the data compaction circuit 13 performs an operation for the random data from the flip-flop 70 at the front stage, and the resultant data is consecutively stored in the flip-flop 70' at the next stage. A compaction of the random data may be achieved by this series of operations.

Here, since one type of data among the n2 data can not be generated, it is considered that one data corresponding to a shortage of the primary data may be generated by a reset signal sent from the reset signal pin 72. However, 2n or another arbitrary number may be employed other than the number of n flip-flops for n bits signals. Note the EOR gate 71 may be substituted for another logic gate or memory device.

As described above, according to the embodiment 1, a test system for a semiconductor device is constituted as follows: the data compaction circuit 13 is provided at the next stage of the input buffer circuit of the DUT 10; the random data generation circuit 18 is provided in the random data generator 15; the data compaction circuit 13 compacts the random data supplied from the random data generation circuit 18 at a real operation speed of the DUT 10; the resultant compacted data are derived to the external LSI tester 205, and may be checked with the expected value 27 to be verified in the comparator 26 therein. Thus, an expensive tester having a timing generator with a high speed operation and a high precision is not required, and may be substituted by a frequency tester in a half or quarter level for the operation frequency of the DUT 10. Therefore, a test quality of the semiconductor device is not deteriorated, and an economical mass production test may be implemented.

However, as shown in FIG. 1, the similar effect as the above is obtained by the following constitution: the random data generation circuit 80 is provided at the front stage of the driver 17 on the side of the output buffer circuit of the DUT 10 so that the DUT 10 itself may verify the high-speed I/O interface at the real operation speed; and the random data output from the random data generation circuit 80 is transmitted to the input pin 11 of the same DUT 10, and is supplied to the data compaction circuit 13 so as to compact the random data.

EMBODIMENT 2

Figure 5:
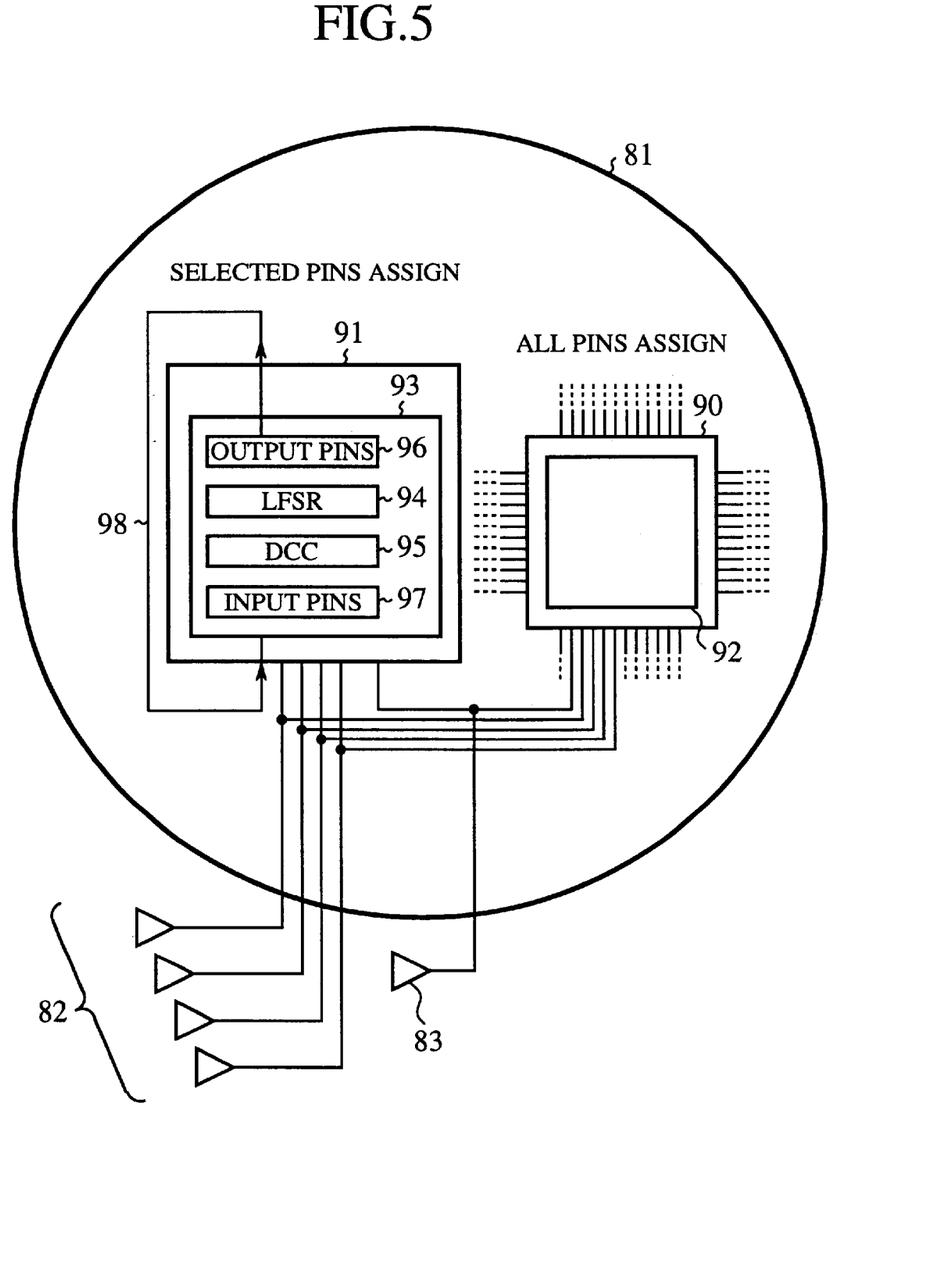
FIG. 5 is a circuit diagram showing a test system for a semiconductor device according to an embodiment 2 of the present invention.

FIG. 5 is a circuit diagram showing a test system for a semiconductor device according to an embodiment 2 of the present invention. In FIG. 51 the reference numeral 81 designates a DUT board as a test board; 82 each designate a JTAG pin; 83 designates a main clock pin; 90 designates a first socket; 91 designates a second socket; 92 designates a DUT as a first semiconductor device; 93 designates a DUT as a second semiconductor device; 94 designates a random data generation circuit; 95 designates a data compaction and comparison circuit; 96 designates output pins; 97 designates input pins; 98 designates a wiring which connects the input pins 97 of the DUT 93 to the output pins 96.

Since the DUT 10 as mentioned in the embodiment 1 is constituted by multiple pins, and is an LSI with a high speed operation, an LSI tester capable of performing a high speed operation with the multiple pins is required. However, this is too expensive to be economical, and a transmission of the aforementioned high speed pulses is physically concerned.

As a remedy, as shown in FIG. 5, both the first socket 90 and the second socket 91 are prepared on the single DUT board 81. All the pins of the first socket 90 are connected to the pins of the LSI tester. As regards the second socket 91, only the signal pins necessary for a self-test of the high-speed I/O interface are connected to the pins of the LSI tester. The signal pins of the second socket 91 are shared with the first socket 90 assigned by all the pins if possible, and are assigned independently for the pins of the LSI tester if not possible, for example, when the driving capacity of the LSI tester driver or the waveform distortion due to impedance mismatching is concerned.

The first socket 90 assigned by all the pins is applied to a DC test of the DUT 92 or a function test which needs pin settings. The DUT 92 determined as "favorable" is exchanged for the second socket 91 and tested as a DUT 93 so as to execute the self-test of the high-speed I/O interface. In this case, the separate DUT 92 and DUT 93 are test executed at the same time and in parallel.

In the self-test of the high-speed interface, the high-speed test is implemented by use of the random data generation circuit 94 and the data compaction and comparison circuit 95 which are mounted on the DUT 93.

As described above, according to the embodiment 2, since a test assigned by all the pins and a real operation test for the input/output buffer circuit in a high-speed operation are may be executable, the number of total testers to be introduced may be reduced, no high-speed tester is needed, and no test quality is deteriorated, thereby implementing an economical, mass production test.

EMBODIMENT 3

Figure 6:
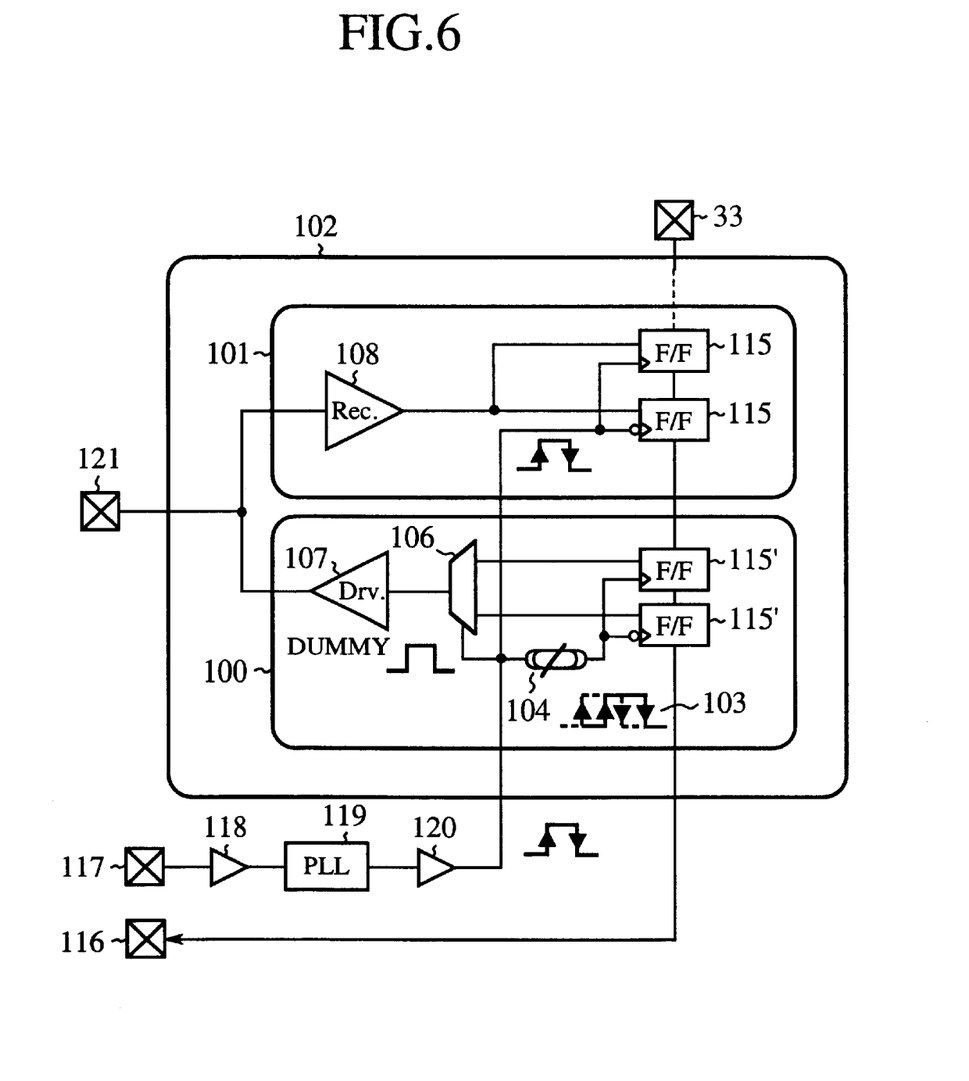
FIG. 6 is a circuit diagram for verifying an input timing in a receiver of a semiconductor device according to an embodiment 3 of the present invention.

FIG. 6 is a circuit diagram for a receiver input timing verification of a semiconductor device according to an embodiment 3 of the present invention. In FIG. 6, the reference numeral 33 designates an external pin (TDI) for inputting a test data; 100 designates a dummy driver cell; 101 designates a receiver cell; 102 designates a cell area; 103 designates a phase shifted clock waveform; 104 designates a vernier circuit; 106 designates a selector; 107 designates a dummy driver circuit; 108 designates a receiver circuit; 115 designates a flip-flop as a second latch circuit on the side of the receiver cell 101; 115' designates a flip-flop as a first latch circuit on the side of the dummy driver cell 100; 116 designates an external pin (TDO) for outputting a test data for verification; 117 designates a clock pin; 118 designates a buffer; 119 designates a PLL; 120 designates a clock driver; and 121 designates a signal pin.

According to this circuit configuration, the dummy driver cell 100 is provided in a group of the receivers 12 as a receiver on the side of the input buffer circuit of the semiconductor device such as the DUT 10 as shown in FIG. 1, and is mounted in the cell area 102, which is similar to the receiver cell 101. Thus, an input timing of "set up" or "hold" may be verified.

The operation will be next described below.

A test data input from the external pin 33 is stored in the flip-flop 115' on the side of the dummy driver cell 100. The clock CLK input from the clock pin 117 becomes a clock waveform 103, which a phase timing is finely shifted due to the vernier circuit 104, through the PLL 119 and so on. The clock waveform 103 enters the flip-flop 115' to output the stored test data, and is output to the receiver cell 101 from the dummy driver cell 100 through the dummy driver circuit 107. This test data shifted a bit in the phase is captured by the flip-flop 115 through the receiver circuit 108 of the receiver cell 101, and scan shifted to verify the timing characteristics of the receiver cell 101 in the tester from the external pin (TDO).

As described above, according to the embodiment 3, for a time verification of set up or hold time of a receiver provided on the side of input pins of a semiconductor device, it is constituted to provide the dummy driver circuit 107 within the cell area 102. Thus, the waveforms of the test data output from the dummy driver cell 100 are output in synchronization with the clocks which enter the dummy driver circuit 107. Since the clocks are timing controlled finely due to the vernier circuit 104, the timing verification, of the receiver may be executed. Therefore, an economical, mass production test may be implemented without needing an expensive tester with a high precision timing.

EMBODIMENT 4.

Figure 7:
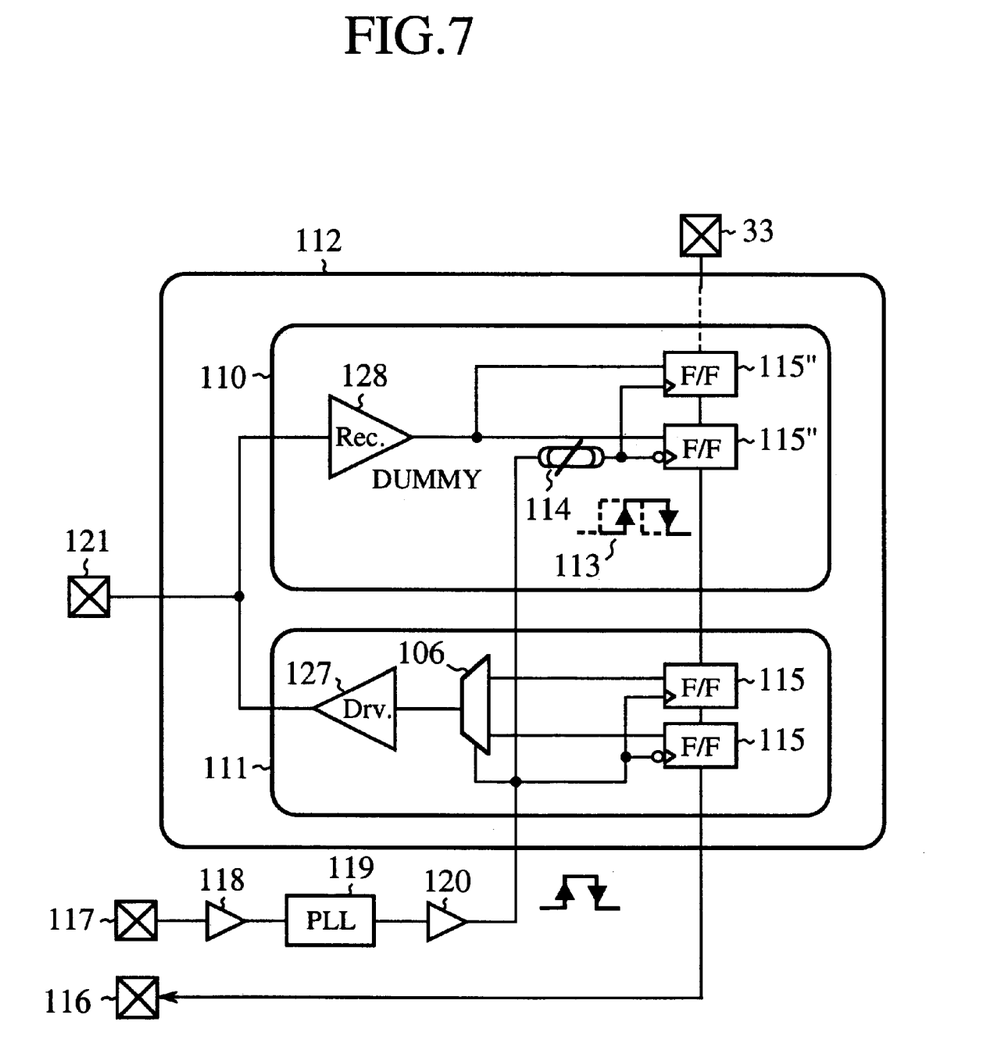
FIG. 7 is a circuit diagram for verifying an input timing in a driver of a semiconductor device according to an embodiment 4 of the present invention.

FIG. 7 is a circuit diagram for an output timing verification of CLK to Q, provided on the side of output pins of a semiconductor device according to an embodiment 4. In FIG. 7, the reference numeral 33 designates an external pin (TDI) for inputting a test data; 110 designates a dummy receiver cell; 111 designates a driver cell; 112 designates a cell area; 113 designates a clock waveform shifted in the phase; 114 designates a vernier circuit; 106 designates a selector; 127 designates a driver circuit; 128 designates a dummy receiver circuit; 115 designates a flip-flop on the side of the driver cell 111 as a third latch circuit; 115" designates a flip-flop on the dummy receiver side as a fourth latch circuit; 116 designates an external pin (TDO) for outputting a test data for verification; 117 designates a clock pin; 118 designates a buffer; 119 designates a PLL; 120 designates a clock driver; and 121 designates a signal pin.

According to this circuit configuration, the dummy receiver cell 110 is provided in the driver 17 as a driver on the side of an output buffer circuit of a semiconductor device such as the DUT 10 as shown in FIG. 1, and is mounted in the cell area 112, which is similar to the driver cell 111. Thus, an output timing from CLK to Q may be verified.

The operation will be next described below.

The data input from the external pin 33 is stored in the flip-flop 115 on the side of the driver cell 111, and the clock CLK input from the clock, pin 117 enters the flip-flop 115 to output the stored test data, and this data is output from the driver cell 111 to the dummy receiver cell 110 through the driver circuit 127. Here, the clock waveform 113 shifted finely in the phase timing due to the vernier circuit 124 enters the flip-flop 115" storing the test data similarly to output the test data, and after scan shifting the test data, the data output from the driver cell 111 through the external pin (TPO) 116 is verified for the timing characteristics.

As described above, according to the embodiment 4, a receiver with a dummy flip-flop is provided for an output timing verification of the driver provided on the side of the output pin of a semiconductor device. Thus, when signals output from the driver is received at the dummy receiver, a clock of the flip-flop is swept and the output timing verification may be implemented at the captured timing. Therefore, an economical, mass production test may be implemented without needing an expensive tester with a high precision timing.

What is claimed is:

1. A semiconductor device having a circuit configuration comprising:

an input buffer circuit, an output buffer circuit, and an internal logic, wherein at least either a data compaction circuit having a data compaction function, a data comparison function, or both is provided at an output of said input buffer circuit, or a random data generation circuit is provided as an input to said output buffer circuit.

2. The semiconductor device according to claim 1, wherein said input buffer circuit further comprises:

a dummy driver cell including a delay circuit which generates a phase shifted clock shifted in a phase timing of a clock input to a first latch circuit and is input by said phase shifted clock, and a dummy driver circuit input by a data generated in such a manner that said phase shifted clock is input to said first latch circuit; and a receiver cell including a receiver circuit for receiving a data from said dummy driver cell, and a second latch circuit which latches and outputs a data from said receiver circuit and a first external pin by an input of said clock.

3. The semiconductor device according to claim 1, wherein said output buffer circuit further comprises:

a dummy driver cell including a third latch circuit which latches and outputs a data from a first external pin by an input clock, and a driver circuit for receiving a data from said third latch circuit through a selector; and a dummy receiver cell including a dummy receiver circuit for receiving a data from said driver cell, a delay circuit for generating a phase shifted clock which is shifted in a phase timing, and a fourth latch circuit which latches and outputs a data from said dummy receiver circuit and said first external pin by said phase shifted clock.

4. A test system for a semiconductor device comprising:

a semiconductor device having a circuit configuration including: an input buffer circuit, an output buffer circuit, and an internal logic, said circuit configuration being implemented by (a) a data compaction circuit having a data compaction function, a data comparison function, or both is provided at an output of said input buffer circuit, or (b) a random data generation circuit is provided as an input to said output buffer circuit, or both of (a) and (b);

a random data generator, incorporating said random data generation circuit, for applying a random data to an input of said input buffer circuit from said random data generation circuit; and a test board mounting said semiconductor device and said random data generator, and electrically connected to each other.

5. The test system for a semiconductor device according to claim 4, wherein said semiconductor device is circuit configured by including a selector provided between said data compaction circuit and said internal logic, and a scan path provided between said data compaction circuit and said external pin.

6. The test system of a semiconductor device according to claim 4, wherein said random data generator includes a clock circuit, and further comprising a delay circuit which is positioned at the next stage of said clock circuit and includes a D/A converter, a resistor, a capacitor, a differential amplifier, and a slew rate buffer.

7. The test system of a semiconductor device according to claim 4, wherein said random data generation circuit and said data compaction circuit are electrically connected to each other through a plurality of latch circuits, and each of said random data generation circuit and said data compaction circuit is constituted by inserting a logic gate in a feedback loop.

8. A test system for a semiconductor device comprising:

a first semiconductor device and a second semiconductor device each including (a) a data compaction circuit having a data compaction function, a data comparison function, or both provided at an output of an input buffer circuit, (b) a random data generation circuit provided as an input to an output buffer circuit, and (c) an internal logic electrically connected to said data compaction circuit and said random data generation circuit;

a first socket assigned for a tester by all the pins of said first semiconductor device;

a second socket assigned for said tester by only the pins selected for a self-test of said second semiconductor device;

a test board on which said first and second semiconductor devices are mounted through said first and second sockets, respectively, wherein an output pin and an input pin of said second semiconductor device are electrically connected to each other on said test board.

* * * * *